(12) United States Patent
Muehlmann et al.

(10) Patent No.: US 12,015,277 B2
(45) Date of Patent: Jun. 18, 2024

(54) SENSOR NODE WITH WIRELESS ENERGY HARVESTING AND METHOD FOR OPERATING THE SENSOR NODE

(71) Applicant: NXP B.V., Eindhoven (NL)

(72) Inventors: Ulrich Andreas Muehlmann, Graz (AT); Michael Schober, Graz (AT)

(73) Assignee: NXP B.V., Eindhoven (NL)

( * ) Notice: Subject to any disclaimer, the term of this patent is extended or adjusted under 35 U.S.C. 154(b) by 100 days.

(21) Appl. No.: 17/814,589

(22) Filed: Jul. 25, 2022

(65) Prior Publication Data
US 2024/0030743 A1    Jan. 25, 2024

(51) Int. Cl.
*H02J 50/00*     (2016.01)
*G01R 19/25*     (2006.01)
*H04B 1/40*     (2015.01)

(52) U.S. Cl.
CPC ........ *H02J 50/001* (2020.01); *G01R 19/2503* (2013.01); *H04B 1/40* (2013.01)

(58) Field of Classification Search
CPC .... H02J 50/001; H02J 50/80; G01R 19/2503; H04B 1/40
See application file for complete search history.

(56) References Cited

U.S. PATENT DOCUMENTS

| | | | |
|---|---|---|---|
| 9,882,428 B2 | 1/2018 | Calhoun et al. | |
| 2010/0076714 A1* | 3/2010 | Discenzo | H02N 2/181 310/319 |
| 2012/0256492 A1* | 10/2012 | Song | H02J 1/102 307/64 |
| 2014/0068089 A1 | 3/2014 | Brandsma et al. | |
| 2016/0219516 A1* | 7/2016 | Subramanian | H04L 12/44 |
| 2017/0271910 A1* | 9/2017 | Lazaro | G06K 7/00 |
| 2017/0295503 A1* | 10/2017 | Govindaraju | H04W 40/00 |
| 2020/0401203 A1 | 12/2020 | Elboim et al. | |
| 2021/0224492 A1 | 7/2021 | Eisendle et al. | |

FOREIGN PATENT DOCUMENTS

EP     2528021 A1    11/2012

OTHER PUBLICATIONS

Cao, Zhonglin et al. "Near-Field Communication Sensors"; School of Electronic Science and Engineering, Nanjing University, Nanjing, China; Sensors 2019, 19(18), 3947; https://doi.org/10.3390/s19183947; Published Sep. 12, 2019.

(Continued)

*Primary Examiner* — Alvaro E Fortich
(74) *Attorney, Agent, or Firm* — Daniel D. Hill

(57) ABSTRACT

A sensor node is provided having a radio frequency (RF) circuit and a sensor interface circuit. The RF circuit wirelessly harvests energy from an external device such as a smart phone to produce a voltage at an output to charge a storage capacitor. The sensor interface circuit is configured to communicate with a sensor. In response to a request from the external device, the sensor node provides a voltage level of the capacitive element to the external device. The external device uses the voltage level to determine capabilities of the sensor node and to control sensing functions of the sensor node. In another embodiment, a method is provided to operate the sensor node.

20 Claims, 3 Drawing Sheets

(56) References Cited

OTHER PUBLICATIONS

Dunna, Manideep et al.; "SyncScatter: Enabling WiFi Like Synchronization and Range for WiFi Backscatter Communication"; nsdi'21 18th USENIX Symposium on Networked Systems Design and Implementation; Apr. 13-14, 2021, Boston, Massachusetts.

Grossi, Marco; "Energy Harvesting Strategies for Wireless Sensor Networks and Mobile Devices: A Review"; Department of Electrical Energy and Information Engineering "Guglielmo Marconi" (DEI), University of Bologna, 40132 Bologna, Italy; Electronics 2021, 10(6), 661; https://doi.org/10.3390/electronics10060661; Published Mar. 12, 2021.

* cited by examiner

SENSOR NODE WITH WIRELESS ENERGY HARVESTING AND METHOD FOR OPERATING THE SENSOR NODE

BACKGROUND

Field

This disclosure relates generally to electronic circuits, and more particularly, to a sensor node with wireless energy harvesting and method for operating the sensor node.

Related Art

The use of wireless energy harvesting based on radio frequency (RF) technology is becoming more widely used to power electronic devices and to charge batteries. However, the use of batteries to power electronic devices can be detrimental for the environment and sometimes difficult to dispose of in an environmentally friendly manner.

The internet of things (IoT) is a connection method for connecting devices for industrial and residential applications used worldwide in millions of devices. Edge nodes are IoT devices that form the computing power for various applications. Among the most common applications involve the use of sensors, but in addition to sensing, the edge nodes also perform the computations for processing the sensed information. The edge node then communicates this information to a user using the internet.

What is needed is an IoT sensor node that operates efficiently without use of a battery, provides minimal power usage, small size, and low cost.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
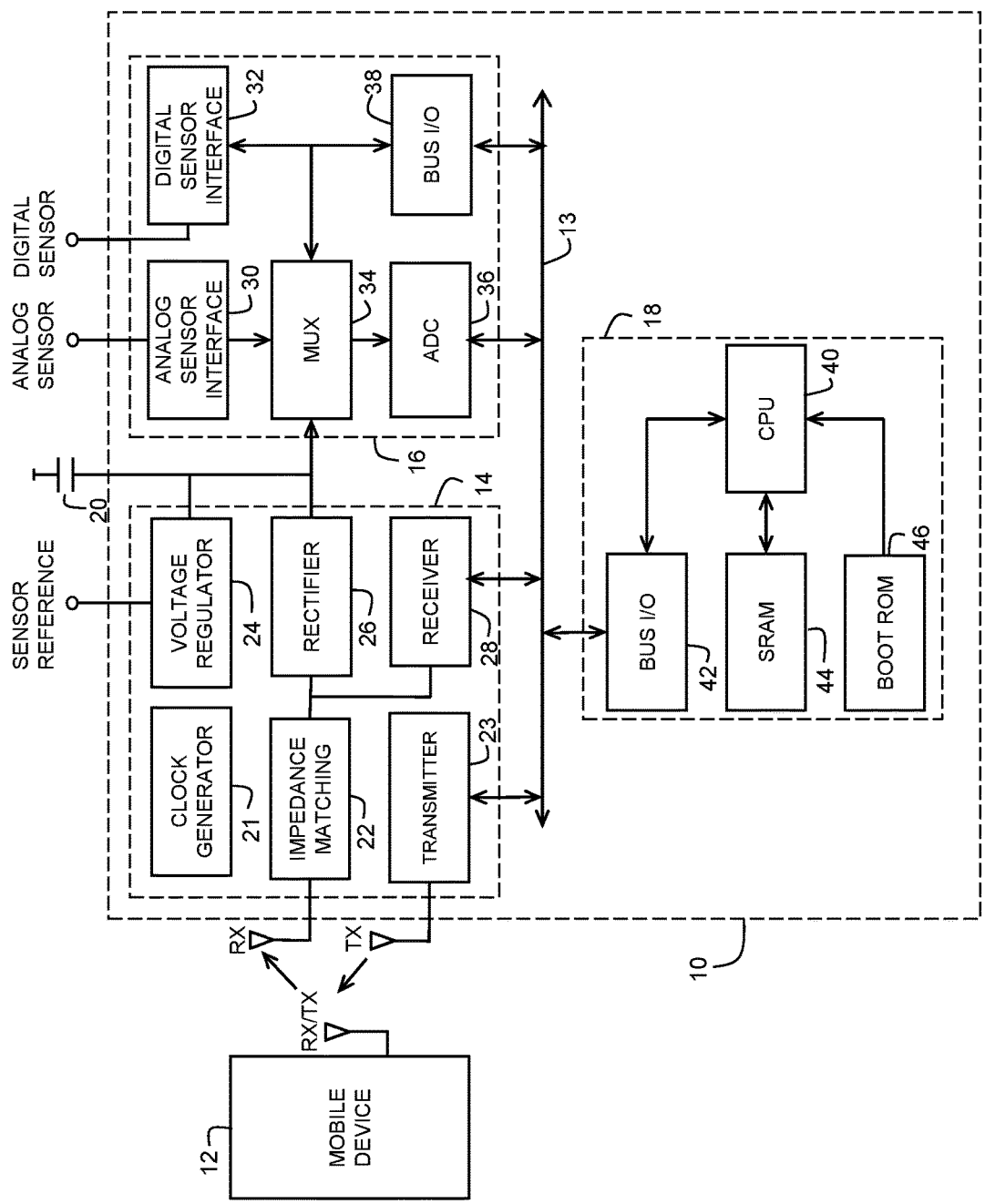
FIG. 1 illustrates a block diagram of a sensor node and an external device in accordance with an embodiment.

Generally, there is provided, a multi-functional sensor node that is powered via a wireless connection with an external device such as a mobile phone or an access point. The sensor node also uses the wireless connection to provide communication between the external device and the sensor node. The sensor node is "power unaware", that is, the sensor node lacks the ability to calculate available energy and how to use the energy. Also, the sensor node does not have a battery. The sensor node uses energy received from the external device to charge a capacitive element. When a voltage on the capacitive element reaches a minimum voltage level for operation of the sensor node, the sensor node provides a notification (ping) to the external device. The external device requests voltage levels from the sensor node and calculates available energy. Using the calculated available energy, the external device determines what sensor functions of the sensor node can be enabled. Multiple different analog and digital sensors can be used based on available power. The external device also controls operations of the sensor node.

Thus, the sensor node is implemented with a low-cost integrated circuit (IC) design allowing the sensor node to be energy efficient, low cost, and that can be used for many applications in, for example, the fields of agriculture and home automation in emerging markets. Also, the elimination of batteries can result in a reduction of die size of integrated circuits and the reduction of the overall production costs of the sensor node.

In accordance with an embodiment, there is provided, a sensor node including: a radio frequency (RF) circuit for wirelessly harvesting energy from an external device to produce a voltage at an output of the RF circuit for charging a capacitive element; and a sensor interface circuit coupled to the capacitive element and to the output of the RF circuit, the sensor interface circuit having a sensor terminal configured to communicate with a sensor, wherein in response to a request from the external device, the sensor node provides a voltage level of the capacitive element to the external device, and wherein the external device uses the voltage level to determine an available energy budget of the sensor node. In response to available energy of the sensor node being below a minimum threshold, a user of the external device may be prompted to move the external device closer to the sensor node. When a voltage level at the sensor terminal reaches a predetermined level, the sensor node may provide a notification to the external element. The notification provided to the external element includes a unique identifier (UID) of the sensor node. The sensor node may further include a voltage regulator coupled to the RF circuit and to the capacitive element, wherein the voltage regulator may have a low precision voltage reference and a high precision voltage reference, wherein the high precision voltage reference has a higher precision than the low precision voltage reference. The sensor node may further include an analog-to-digital converter (ADC) operating in either a high precision mode or a low precision mode, wherein the ADC and the voltage regulator together may provide the sensor node with a low-resolution mode for low resolution sensor measurements, and a high-resolution mode for high resolution sensor measurements, and wherein the high-resolution mode may have a higher resolution than the low-resolution mode. The RF circuit may communicate with the external device using a backscattering scheme. Program code for a sensing operation may be downloaded to the sensor node by the external device on demand. The external device may track energy of the sensor node during the transfer of the program code to make sure the transfer is successful.

In another embodiment, there is provided, a sensor node including: a radio frequency (RF) circuit for wirelessly harvesting energy from, and wirelessly communicating with, an external device to produce a voltage for charging a capacitive element; a sensor interface circuit coupled to receive a voltage from the RF circuit and the capacitive element, the sensor interface circuit having a first sensor terminal configured to communicate with an analog sensor and a second sensor interface having a second sensor terminal configured to communicate with a digital sensor; a voltage regulator coupled to the capacitive element, wherein energy begins to charge the capacitive element in response to a proximity of the external device to the sensor node, and wherein in response to a voltage level of the voltage regulator reaching a predetermined level, the sensor node providing a notification to the external device; and a digital control circuit coupled to control sensing operations of one or more sensors coupled to the sensor interface, wherein in response to a request from the external device, the sensor node provides a voltage level of the capacitive element to the external device, and wherein the external device uses the voltage level to determine capabilities of the sensor node. The notification may include a unique identifier (UID). program code for a sensing operation of the sensor node may be downloaded by the external device to the sensor node on demand. The external device may track node energy of the sensor node during the transfer of the program code to make sure the transfer is successful. Operation of the sensor node may end when the proximity of the external element to the sensor node is out of range. The external device may be one of either a smart phone or an access point.

In yet another embodiment, there is provided, a method for operating a sensor node, the method including: establishing a wireless communication and wireless energy transfer between the sensor node and an external device; using the wireless energy transfer to charge a capacitive element; transmitting a notification to the external device in response to a voltage on the capacitive element reaching a first voltage level for supporting minimum functions of the sensor node; receiving a request from the external device to measure the voltage on the capacitive element; and transmitting the voltage on the capacitive element to the external device, wherein the external device determines what functions of the sensor node can be performed based on the voltage on the capacitive element. Energy may be transferred from the external device to the sensor node based on a proximity of the external device to the sensor node. The wireless communication and wireless energy transfer may be performed with one of Wi Fi or near field communication (NFC). The notification includes a unique identifier (UID) of the sensor node. Transmitting the notification to the external device may further include using a backscattering scheme to transmit the notification.

FIG. 1 illustrates a high-level block diagram of sensor node 10 and external device 12 in accordance with an embodiment. Sensor node 10, as illustrated, is only one example embodiment of a sensor node that is power unaware. Other embodiments are possible. Sensor node 10 may be implemented using one or more integrated circuits. Sensor node 10 include bus 13, radio frequency (RF) circuit 14, sensor interface circuit 16, and digital control circuit 18. Bus 13 may be any type of bus or switching network or other form of interconnection for communication between the circuits of sensor node 10. RF circuit 14 includes clock generator 21, impedance matching circuit 22, transmitter 23, voltage regulator 24, rectifier 26, and receiver 28. Sensor interface circuit 16 includes analog sensor interface 30, digital sensor interface 32, multiplier 34, analog-to-digital converter (ADC) 36, and bus input/output (I/O) circuit 38. Digital control circuit 18 includes central processing unit (CPU) 40, bus I/O circuit 42, static random-access memory (SRAM) 44, and boot read only memory (ROM) 46. Note that clock generator 21 provides timing signals to the various circuits of sensor 10. However, for the purposes of simplicity and clarity, the clock signal routing is not shown. Also, for the same reason, power and ground distribution of sensor node 10 is not shown.

Sensor node 10 wirelessly communicates with, and wirelessly receives energy from, external device 12. In one embodiment, external device 12 is a mobile device, which may also be referred to as, e.g., a smart phone or a mobile phone. In another embodiment, external device 12 may be, e.g., an access point (AP). An AP may provide connectivity from sensor node 10 to a local area network (LAN) where a device on the LAN can connect to sensor node 10. The wireless connectivity can be any kind of wireless connectivity that provides for energy harvesting by sensor node 10. For example, Wi Fi and near field communication (NFC) can each provide wireless energy harvesting while also being used for communication.

In sensor node 10, RF circuit 14 is responsible for energy harvesting and communication with external device 12. External device 12 has an antenna labeled "RX/TX" which is for both transmitting and receiving. In other embodiments, external device 12 may have a separate receiver (RX) antenna and transmitter (TX) antenna. In RF circuit 14, transmitter 23 transmits messages or data received from bus 13 to mobile device 12 using an antenna labeled "TX". Transmitter 23 may use an appropriate transmission mechanism, such as for example, a back scattering scheme. Transmissions from external device 12 are received at an antenna labeled "RX". Both communication and energy are received and passed through impedance matching 22 to either rectifier 26 or receiver 28 depending on whether the transmission is a communication or energy transfer. Receiver 28 and transmitter 23 are both connected to bus 13 for configuration and data transfer. To begin operation of sensor node 10, energy is received from external device 12, which may be a mobile phone placed proximate to sensor node 10. The distance between sensor node 10 and external device 12 required for energy transfer depends on the energy harvesting mechanism used, e.g., Wi Fi or NFC. Rectifier 26 converts the energy, which may be in the form of a time varying voltage to a DC (direct current) voltage which is used to charge storage capacitor 20. Storage capacitor 20 may be any type of capacitor and can be either an external capacitor connected to terminals of sensor node 10 or implemented internally. Storage capacitor 20 has a first terminal connected to a supply terminal, such as ground, and a second terminal connected to an output of rectifier 26. Voltage regulator 24 is connected to the second terminal of capacitor 20. An output of voltage regulator 24 is connected to a terminal to which sensors can be coupled to receive a reference voltage labeled "SENSOR REFERENCE". Voltage regulator 24 has two functions to provide high precision and low precision voltage references to support high precision sensor measurements or just low precision sensor measurements and to operate the basic communication functions and drive ADC 36 in low precision mode. These voltages are selectively available external to sensor node 10 on the terminal SENSOR REFERENCE. The output of voltage regulator 24 switches its low precision and high precision reference voltage to the terminal SENSOR REFERENCE. By default, the output of voltage regulator 24 is switched off to ensure a regular start-up of sensor node 10. Furthermore, a base power state is entered when voltage regulator 24 has reached a certain voltage threshold (e.g., 1.8V) in low precision mode. Note that in another embodiment, sensors may be implemented internally to sensor node 10.

Sensor interface circuit 16 is responsible for performing the sensing or measuring task of sensor node 10. In sensor interface circuit 16, analog sensor interface 30 has an external terminal labeled "ANALOG SENSOR" that connects an analog sensor such as, e.g., a temperature sensor or a humidity sensor that provides a resistance measurement. Digital sensor interface 32 has an external terminal that communicates with a more sophisticated digital sensor. Various sensors can be connected to sensor interface circuit 16, such as temperature, humidity, shock, pressure, range, etc., over analog sensor interface 30 and digital sensor interface 32. Multiplexer 36 has a first input connected to storage capacitor 20, a second input connected to analog sensor interface 30, and an output connected to an input of ADC 36. Multiplexer 34 is controlled via instructions on bus 13 via bus I/O 38 to allow ADC 36 to be time shared. Analog-to-digital converter 36 has a low precision mode and a high precision mode. In one state multiplexer 34 enables analog to digital conversion of the storage capacitor voltage. In the other state, multiplexer 34 provides a sensed voltage drop over, e.g., an external sensor resistance such as from a temperature sensor that is proportional to the measured temperature. There could be other states as well. The input mode of multiplexer 34 can be changed on request by external device 12, regardless which source is sampled. A default mode of ADC 36 may be the low precision mode, which provides lower power consumption. The high precision mode may be used for higher precision sensor measurements and may be used to provide a more accurate measurement of the voltage on storage capacitor 20. The low precision mode may be used to measure storage capacitor voltage to ensure that the high precision mode is not entered without sufficient stored energy. Digital sensor interface 32 connects with a digital sensor connected at terminal "DIGITAL SENSOR" using, e.g., serial peripheral interface (SPI), inter-integrated controller (I2C), or universal asynchronous receiver/transmitter UART). Digital sensor interface 32 has a connection to the internal bus via bus I/O 38 for configuration and data transfer.

Digital control circuit 18 is responsible for controlling function selection of sensor node 10. Digital control circuit 18 includes CPU 40 for executing instructions received from boot ROM 46 and SRAM 44. CPU 40 may include any hardware device capable of executing instructions stored in SRAM 34. CPU 40 may be, for example, a microprocessor, field programmable gate array (FPGA), application-specific integrated circuit (ASIC), or similar processor. Digital control circuit 18 does not boot-up immediately after the base power state is reached. Boot ROM 46 is provided to correct start-up behavior, and to provide fault prevention and memory segmentation of firmware to be executed from SRAM 44. Besides the very basic boot ROM 46, all program code and data are provided by external device 12 "on demand" through an APP accessed by external device 12. CPU 40 communicates with other circuits of sensor node 10 via bus I/O 42.

As mentioned above, sensor node 10 harvests energy from an external device such as a mobile device or AP. Sensor node 10 does not have the ability to determine its power capabilities but has basic capability to measure a voltage on storage capacitor 20 and communicate this measurement to the external device or AP on request. The mobile device or AP computes the power capabilities of sensor node 10 and enables functions of the sensor node based on the computed power capabilities. When receiving energy from an external device, sensor node 10 has a basic power-on state. On reaching the basic power-on state, sensor node 10 will issue a single ping notifying this state has been reached to the external device 12. Note that sensor node 10 does not have any non-volatile memory (NVM), e.g., electrically erasable and programmable read only memory (EEPROM) or FLASH memory. Sensor node 10 functions such that measurement or sensing are controlled by external device 12 depending on the amount of energy available on storage capacitor 20. External device 12 can manage its access to sensor node 10 to be the exclusive harvesting source provider to avoid blocking based on a network protocol layer.

Sensor node 10 is power un-aware. This means that the node is not capable of determining the amount of energy available and what to do with the energy supply. All this information and its control is reserved to external device 12. This allows a very low-cost IC design and production.

Figure 2:
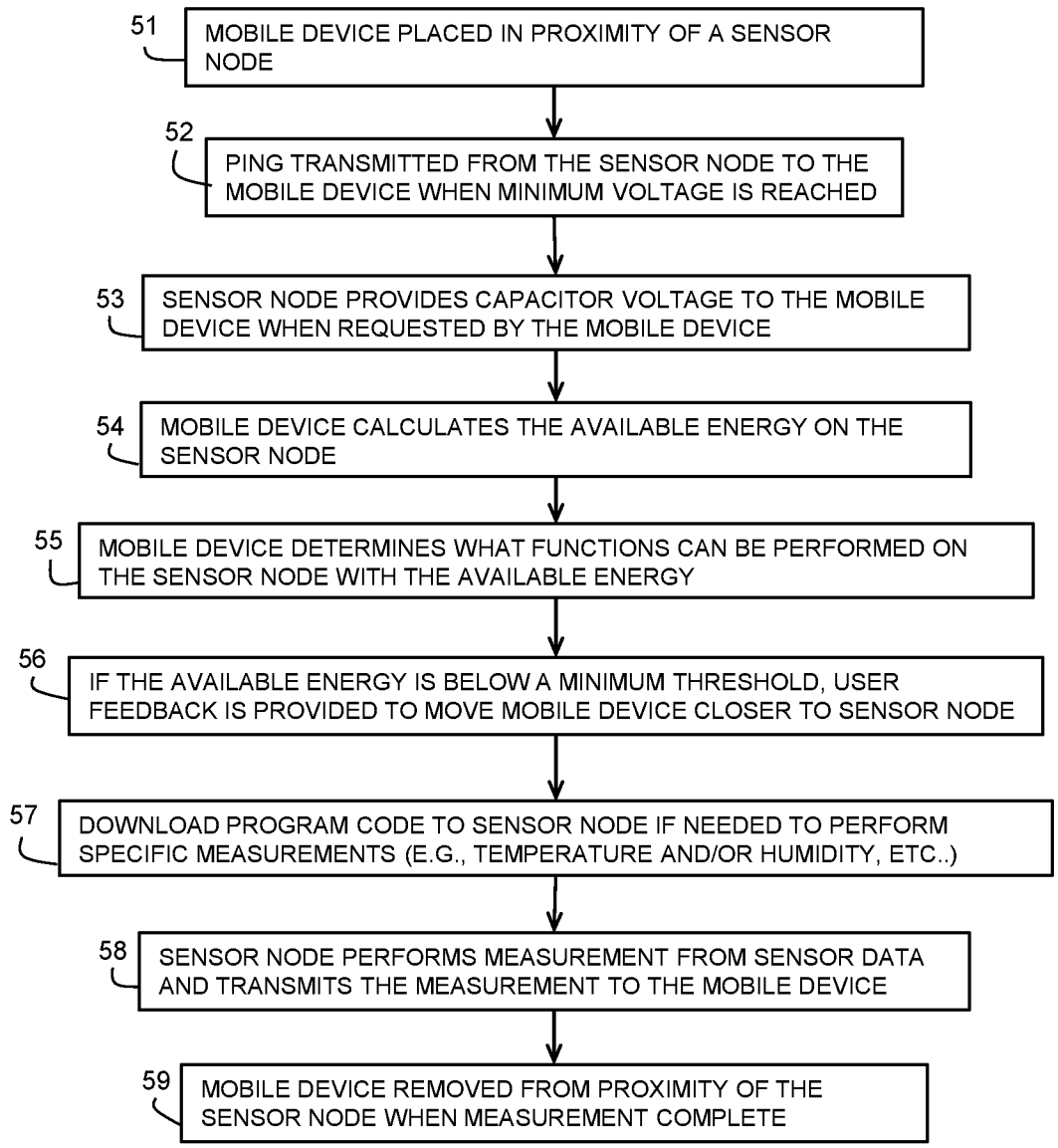
FIG. 2 illustrates a method for operating the sensor node of FIG. 1 in accordance with an embodiment.

FIG. 2 illustrates method 50 for operating sensor node 10 of FIG. 1 in accordance with an embodiment. Method 50 begins at step 51. At step 51, an external device such as mobile device 12 of FIG. 1 is positioned near sensor node 10. An APP for wireless energy transfer from external device 12 is turned on. The APP will enable the WIFI or NFC communication link and sensor node 10 starts to harvest energy out of external device 12 TX power. The distance required for communication depends, at least in part, on the communication technology being used for energy harvesting. The energy transferred to sensor node 10 will activate the sensor node when a minimum voltage on storage capacitor 20 is reached. At step 52, sensor node 10 provides a notification (ping) when the minimum voltage is reached on voltage regulator 24 for low precision mode. The ping may include a unique identifier (UID) for sensor node 10. The ping indicates that sensor node 10 is able to serve minimal functions such as low-resolution ADC measurement and communication. However, in case of a timeout, the UID may be requested by external device 12 through a dedicated command. To cope with collisions, external device 12 can also request the UIDs of the surrounding devices. External device 12 may request a UID in case the application does not receive the UID with the ping. At step 53, external device 12 requests sensor node to measure the voltage on storage capacitor 20. Sensor node 10 does the measurement and communicates the voltage to external device 12. The APP on external device 12 tracks the voltage level over time, and by knowing the UID, the APP is able to identify the size of storage capacitor 20 and the capabilities of sensor node 10 as provided at step 54. The APP on external device 12 tracks the energy available on sensor node 10. At step 55, the external device uses the available energy information to determine what functions can and cannot be performed by sensor node 10 with the available energy in line with the capabilities of sensor node 10 and the request by a user of external device 12. At step 56, if available energy is below a minimum threshold voltage, a request may be provided to the user to move external device 12 closer to sensor node 10. Otherwise, external device 12 may simply wait until sufficient energy is available. When sufficient power is available, method 50 continues to step 57. If extra program code is required to perform specific operations of sensor node 10, the extra program code can be downloaded and delivered on demand as provided at step 57. After download, or if a download is not necessary, method 50 will proceed to step 58. Examples of specific program code may be code for performing specific measurements, such as, temperature and humidity. During the download process, external device 12 tracks the sensor node energy to make sure the download will succeed. External device 12 may control the download speed and packet size to maintain communication link stability. At step 58, CPU 40 is booted up, traps into the new program code, which may be firmware, and executes the requested functions using sensor data to compute requested measurements and transmit the measurements to external device 12. If further measurements are required, method 50 returns to step 53 and steps 53 through 58 are repeated. At step 59, after a successful operation, external device 12 is removed from the proximity of sensor node 10, storage capacitor 20 discharges, and sensor node 10 will return to a non-functional state.

Figure 3:
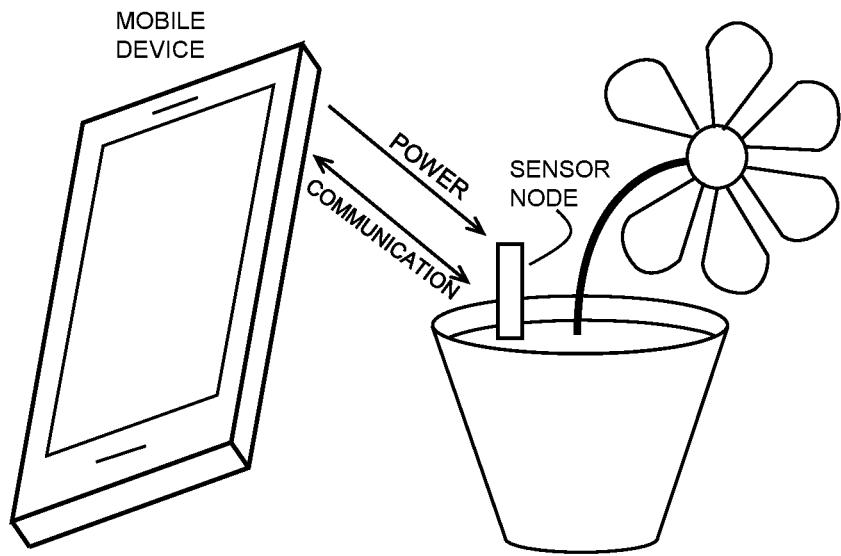
FIG. 3 and FIG. 4 illustrate examples of applications in which the sensor node of FIG. 1 is useful.
Figure 4:
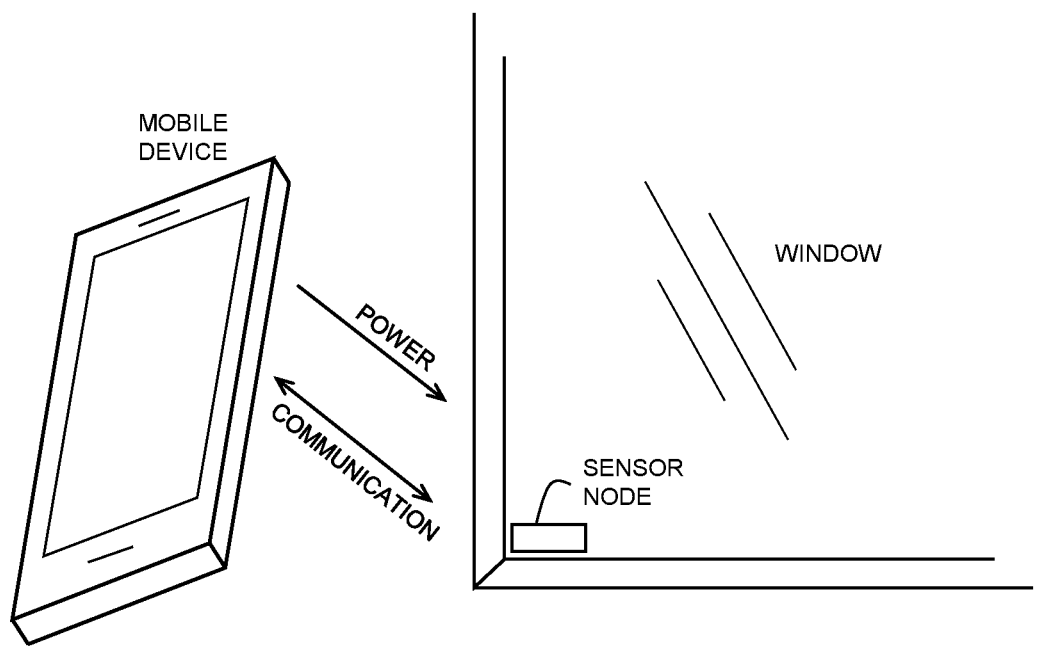

FIG. 3 and FIG. 4 each illustrate examples of applications in which sensor node 10 of FIG. 1 is useful. FIG. 3 illustrates an agricultural environment where sensor node 10 is placed in the soil of a pot having a plant with the appropriate sensors attached (not shown) to measure temperature, moisture, and ph value of the soil. FIG. 4 illustrates sensor node 10 affixed to a window to measure, e.g., temperature or moisture in the window frame.

Various embodiments, or portions of the embodiments, may be implemented in hardware or as instructions on a non-transitory machine-readable storage medium including any mechanism for storing information in a form readable by a machine, such as a personal computer, laptop computer, file server, smart phone, or other computing device. The non-transitory machine-readable storage medium may include volatile and non-volatile memories such as read only memory (ROM), random access memory (RAM), magnetic disk storage media, optical storage medium, flash memory, and the like. The non-transitory machine-readable storage medium excludes transitory signals.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is not intended to be limited to a direct coupling or a mechanical coupling.

What is claimed is:

1. A sensor node comprising:
a radio frequency (RF) circuit for wirelessly harvesting energy from an external device to produce a voltage at an output of the RF circuit for charging a capacitive element; and
a sensor interface circuit coupled to the capacitive element and to the output of the RF circuit, the sensor interface circuit having a sensor terminal configured to communicate with a sensor,
wherein in response to a request from the external device, the sensor node provides a voltage level of the capacitive element to the external device, and wherein the external device uses the voltage level to determine an available energy budget of the sensor node.

2. The sensor node of claim 1, wherein in response to available energy of the sensor node being below a minimum threshold, a user of the external device is prompted to move the external device closer to the sensor node.

3. The sensor node of claim 1, wherein when a voltage level at the sensor terminal reaches a predetermined level, the sensor node provides a notification to the external element.

4. The sensor node of claim 3, wherein the notification provided to the external element includes a unique identifier (UID) of the sensor node.

5. The sensor node of claim 1, further comprising a voltage regulator coupled to the RF circuit and to the capacitive element, wherein the voltage regulator has a low precision voltage reference and a high precision voltage reference, wherein the high precision voltage reference has a higher precision than the low precision voltage reference.

6. The sensor node of claim 5, further comprising an analog-to-digital converter (ADC) operating in either a high precision mode or a low precision mode, wherein the ADC and the voltage regulator together provide the sensor node with a low-resolution mode for low resolution sensor measurements, and a high-resolution mode for high resolution sensor measurements, and wherein the high-resolution mode has a higher resolution than the low-resolution mode.

7. The sensor node of claim 1, wherein the RF circuit communicates with the external device using a backscattering scheme.

8. The sensor node of claim 1, wherein program code for a sensing operation is downloaded to the sensor node by the external device on demand.

9. The sensor node of claim 8, wherein the external device tracks energy of the sensor node during the transfer of the program code to make sure the transfer is successful.

10. A sensor node comprising:
a radio frequency (RF) circuit for wirelessly harvesting energy from, and wirelessly communicating with, an external device to produce a voltage for charging a capacitive element;
a sensor interface circuit coupled to receive a voltage from the RF circuit and the capacitive element, the sensor interface circuit having a first sensor terminal configured to communicate with an analog sensor and a second sensor interface having a second sensor terminal configured to communicate with a digital sensor;
a voltage regulator coupled to the capacitive element, wherein energy begins to charge the capacitive element in response to a proximity of the external device to the sensor node, and wherein in response to a voltage level of the voltage regulator reaching a predetermined level, the sensor node providing a notification to the external device; and
a digital control circuit coupled to control sensing operations of one or more sensors coupled to the sensor interface,
wherein in response to a request from the external device, the sensor node provides a voltage level of the capacitive element to the external device, and wherein the external device uses the voltage level to determine capabilities of the sensor node.

11. The sensor node of claim 10, wherein the notification includes a unique identifier (UID).

12. The sensor node of claim 10, wherein program code for a sensing operation of the sensor node is downloaded by the external device to the sensor node on demand.

13. The sensor node of claim 12, wherein the external device tracks node energy of the sensor node during the transfer of the program code to make sure the transfer is successful.

14. The sensor node of claim 10, wherein operation of the sensor node ends when the proximity of the external element to the sensor node is out of range.

15. The sensor node of claim 10, wherein the external device is one of either a smart phone or an access point.

16. A method for operating a sensor node, the method comprising:
    establishing a wireless communication and wireless energy transfer between the sensor node and an external device;
    using the wireless energy transfer to charge a capacitive element;
    transmitting a notification to the external device in response to a voltage on the capacitive element reaching a first voltage level for supporting minimum functions of the sensor node;
    receiving a request from the external device to measure the voltage on the capacitive element; and
    transmitting the voltage on the capacitive element to the external device, wherein the external device determines what functions of the sensor node can be performed based on the voltage on the capacitive element.

17. The method of claim 16, wherein energy is transferred from the external device to the sensor node based on a proximity of the external device to the sensor node.

18. The method of claim 16, wherein the wireless communication and wireless energy transfer are performed with one of Wi Fi or near field communication (NFC).

19. The method of claim 16, wherein the notification includes a unique identifier (UID) of the sensor node.

20. The method of claim 16, wherein transmitting the notification to the external device further comprises using a backscattering scheme to transmit the notification.

* * * * *